United States Patent
Poon et al.

(10) Patent No.: US 8,096,842 B2
(45) Date of Patent: Jan. 17, 2012

(54) ELECTRO-MECHANICAL CONNECTOR FOR SOLAR ARRAYS

(75) Inventors: Daniel Poon, Foothill Ranch, CA (US); Kyle Smith, Foothill Ranch, CA (US)

(73) Assignee: Bal Seal Engineering, Inc., Foothill Ranch, CA (US)

( * ) Notice: Subject to any disclaimer, the term of this patent is extended or adjusted under 35 U.S.C. 154(b) by 0 days.

(21) Appl. No.: 12/787,602

(22) Filed: May 26, 2010

(65) Prior Publication Data

US 2010/0304623 A1   Dec. 2, 2010

Related U.S. Application Data

(60) Provisional application No. 61/182,423, filed on May 29, 2009.

(51) Int. Cl.
*H01R 13/33* (2006.01)
(52) U.S. Cl. .......................................... 439/840; 439/65
(58) Field of Classification Search ...................... 439/65, 439/840, 322, 349; 136/244, 256
See application file for complete search history.

(56) References Cited

U.S. PATENT DOCUMENTS

| | | | |
|---|---|---|---|
| 4,296,270 A | 10/1981 | Kohler | |
| 4,350,836 A | 9/1982 | Crouthamel et al. | |
| 4,685,608 A | 8/1987 | Kujas | |
| 5,727,821 A * | 3/1998 | Miller | 285/318 |
| 5,919,316 A | 7/1999 | Bogorad et al. | |
| 6,093,884 A | 7/2000 | Toyomura | |
| 6,101,778 A * | 8/2000 | Martensson | 52/582.1 |
| 7,592,537 B1 * | 9/2009 | West | 136/251 |
| 7,856,769 B2 * | 12/2010 | Plaisted et al. | 52/173.3 |
| 7,918,694 B1 * | 4/2011 | Stahl et al. | 439/840 |
| 2008/0066801 A1 * | 3/2008 | Schwarze | 136/251 |

* cited by examiner

*Primary Examiner* — Renee S Luebke
*Assistant Examiner* — Larisa Tsukerman
(74) *Attorney, Agent, or Firm* — Klein, O'Neill & Singh, LLP

(57) ABSTRACT

A connector assembly is provided for connecting two planar surfaces or structures together to permit electrical transmission between the two. As described, the connector have at least two housing sections having grooves formed therein for receiving springs, such as canted coil springs. The springs are configured to provide constant mechanical and electrical connection between multiple parts and allow for small motions between such parts. By allowing for movement of the connected parts, adequate connection during thermal changes and/or vibrations is maintained. This is possible due to the spring contact interface between the connector assembly and the connecting parts, which allows relative movement between the springs and the connecting parts.

20 Claims, 2 Drawing Sheets

ELECTRO-MECHANICAL CONNECTOR FOR SOLAR ARRAYS

CROSS-REFERENCE TO RELATED APPLICATION

This is a regular utility application based on provisional application No. 61/182,423, filed May 29, 2009, the contents of which are expressly incorporated herein by reference.

FIELD OF ART

Mechanical connectors that connect two or more parts or panels together are generally discussed herein. Specific discussions include connectors for connecting two or more parts or panels together for electrical applications in which electrically conductive components are used to allow for current flow from one part to another. The disclosed connectors may be viewed or thought of as conduits for electrical flow across different panels.

BACKGROUND

A photo-voltaic solar array is a means for converting solar radiation into electricity, which is well known in the art. A solar array typically consists of a collection of solar cells integrated with a structural support system, an environmental protection system, and an electrical energy distribution system. In some instances there are additional sub-systems such as concentrating optics and pointing systems. The systems are used in terrestrial applications and in space applications. A common problem area in using solar arrays is the reliability of the connection between the electrical energy distribution system and the solar cells. Exemplary prior art patents directed to solar cells or arrays include U.S. Pat. Nos. 4,296,270; 4,350,836; 4,685,608; 6,093,884; and 6,870,087; the contents of each of which are expressly incorporated herein by reference.

The current state of the art is to bond solar cells to their structural support using flexible adhesive, such as room-temperature vulcanizing (RTV) adhesive, and weld a thin foil conductor to the connector pads on the solar cells. An exemplary prior patent that discloses bonding between solar cells is U.S. Pat. No. 5,919,316 to Bogorad, et al., the contents of which are expressly incorporated herein by reference.

Solar cells are thin and brittle polycrystalline semi-conductor structures, similar in structural characteristics to silicon computer chips. The attachment of the conductive foil or wire to the cells involves the joining of dissimilar materials, usually by welding or soldering, which can cause weakened areas. Cyclic stresses due to periodic thermal changes can and often result in fatigue crack propagation in the joint that can ultimately lead to joint failure. When an electrical connection to the solar cell is broken, no energy flows from that cell and if that cell is in series with other cells, an entire string of cells can be out of service, thus reducing the overall system efficiency.

SUMMARY

An improvement would be an interconnect system, such as an electrical conduit, that allows small motions of the solar cells relative to one another with reduced or without cyclic stress in the current path compared to prior art joints. An additional benefit would be if the interconnect system allows for individual solar cells to be removed and replaced, such as during a repair and/or replacement.

In an embodiment, an electro-mechanical connector is provided comprising multiple housings and springs that engage the connecting parts to mechanically hold such parts together and permit current flow between the two via the connector. The housings and springs, both being electrically conductive, will provide a constant electrical connection as well as mechanical connection under thermal cycling, vibration, and small motions between connecting parts. The same connector may be used in holding, locking, or latching applications.

An example could be an electro-mechanical connector comprising two housings, a connecting pin, and three springs, such as shown in FIG. 1. In other embodiments, more than three springs may be used and the housings may be made from multiple housing components or parts that are connected together.

The present devices, systems, and methods allow for a compliant mechanical and electrical contact between two elements, which have planar surface portions, such as for example a solar cell and a support structure, comparable in purpose as prior art bonding and welding combination. The solar cell, a rigid and brittle structure, is allowed to expand and contract with thermal strain without the support structure, such as a connector or an electrical conduit, imparting stresses on the crystalline structure. Long solar cell life is expected with the present device, system, and method due to the reduced or zero stress induced by the connector, which allows two adjacent cells to move relative to one another while maintaining electrical contact between the two.

In certain embodiments, the upper part of the housing is removable to allow a single solar cell to be replaced, if needed—such as when damaged.

The present devices, systems, and methods can be regulated so that contact forces imparted by the canted coil spring contact element on the panel or surface to be connected can be tailored to a variety of levels—ensuring that the optimal force is imparted.

Thus, an aspect of the present device and system may be understood to include a connector for connecting two elements, which have planar surface portions, together. The connector can comprise a first housing piece and a second housing piece, said first and second housing pieces each comprising a conductive material. The connector further can include a connecting piece for mechanically interlocking said first and second housing pieces together, said connecting piece projecting, at least in part, into the first housing section. Wherein said first and second housing pieces can each comprise at least one groove comprising a canted coil spring disposed therein.

An aspect of the present method may be understood to include a method for connecting two elements, which have planar surface portions, together. The method can comprise the steps: placing a first housing piece against a first element so that a spring disposed in a groove in said first housing piece contacts a planar surface of said first element; placing a second housing piece against the first element and a second element so that a spring disposed in a groove in said second housing piece contacts a planar surface of said second element; projecting a connecting piece into a gap of said first housing piece; and securing said connecting piece with said first housing piece so that a spring force is biased against said first element and said second element.

DESCRIPTION OF DRAWINGS

The various embodiments of the present connectors, systems, and associated methods now will be discussed in detail with an emphasis on highlighting the advantageous features.

These embodiments depict the novel and non-obvious connector shown in the accompanying drawings, which are for illustrative purposes only. These drawings include the following figures, in which like numerals indicate like parts.

DETAILED DESCRIPTION

Figure 1:
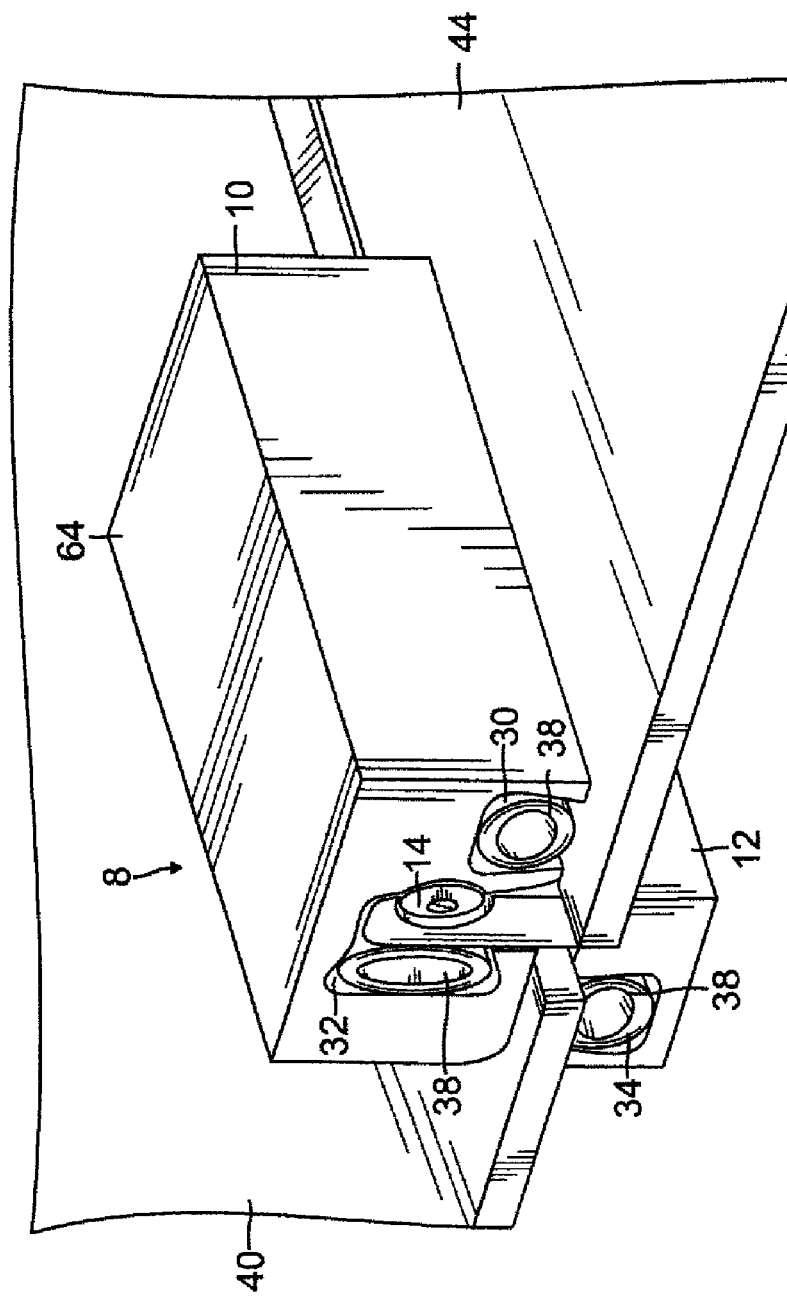
FIG. 1 shows a perspective view of an electro-mechanical connector with two housings, a connecting pin, and three springs for mechanical and electrical connection of two solar cells to permit current flow between the two.

The following detailed description describes the present embodiments with reference to the drawings. In the drawings, reference numbers label elements of the present embodiments. These reference numbers are reproduced below in connection with the discussion of the corresponding drawing features.

The embodiments of the present connectors, systems, and associated methods are described below with reference to the figures. These figures, and their written descriptions, indicate that certain components of the apparatus are formed integrally, and certain other components are formed as separate pieces. Those of ordinary skill in the art will appreciate that components shown and described herein as being formed integrally may in alternative embodiments be formed as separate pieces. Those of ordinary skill in the art will further appreciate that components shown and described herein as being formed as separate pieces may in alternative embodiments be formed integrally. Further, as used herein the term integral describes a single unit or a unitary piece and whereas a unitary piece means a singularly formed single piece, such as a singularly formed mold or cast.

As used herein, the terms "first", "second", "upper", and "lower" are relative terms intended to distinguish between different components but not to limit the scope or features of those components unless the context indicates otherwise.

FIG. 1 shows a two piece housing 10, 12 joined by a connecting pin 14 provided in accordance with aspects of the present device, system and method. In one example, the pin is generally circular in cross-section. However, the pin can embody a square cross-section, a triangular cross-section, an oval cross-section, a polygon cross-section, such as a five-sided regular polygon, a six-sided regular polygon, or an irregular polygon. In other embodiments, the connecting pin can have a trapezoidal cross-section, a tapered cross-section, or a complex-shaped cross-section, such as a square cross-section with raised ridges or a star shape.

The housings 10, 12 contain a plurality of spring grooves, including two grooves 30, 32 in the upper housing section 10 and one groove 34 in the lower housing section 12 for receiving a plurality of springs 38. A pin groove 36 formed in part by a vertical standing rib 16 and the upper housing section 10 defines a gap that allows for insertion of a locking pin 14. The pin 14 is held in place by the geometry of the pin groove 36 as well as the force exerted on the vertical standing rib 16 by the locking spring 35. As shown, the lower housing section 12 is unitarily formed (i.e., singularly formed) with a lower housing block 60 and the vertical standing rib 16, which resembles a backward "L" having a spring groove 34 and a partial pin groove 62 formed therein. In another embodiment, the lower housing block 60 and the vertical standing rib 16 are separately formed and attached to one another, such as by welding, interference, threading, etc. Thus, the vertical standing rib 16 acts like a connecting piece for the lower housing block 60 and the upper housing section 10.

To assemble the connector 8, the lower housing piece 12 is placed under the solar array substrate 40. The solar cells are laid on the substrate 40 such that the conductive tab 42 on the underside of the substrate 40 makes contact with the spring 38. In another embodiment, the lower housing piece 12 is bonded to the solar array substrate 40. The upper housing piece 10 with two springs 38 positioned in their respective grooves 30, 32 is then placed over the central rib 16 of the lower housing piece 12, and over the two adjacent solar cells 40, 44. One spring 38 makes contact with the vertical standing rib 16 and the other spring makes contact with the upper contact pad 46 of the second solar cell 44. The upper housing 14 is pressed downward, compressing the springs 30 until the pin groove 36 align to form a cylindrical hole or gap, whereupon the locking pin 14 is inserted. In one example, two or more connectors 8 are used per adjacent pairs of solar cells 40, 44. In another example, multiple rows of grooves and springs are incorporated to contact each solar panel. The springs are each understood to be extended with two spring ends being at opposite ends of the spring, i.e., not connected like a garter-type. In yet another embodiment, a plurality of round grooves are incorporated into the housing pieces for accommodating a plurality of garter-type springs for each housing contact surface with a solar panel. This alternative embodiment resembles a row of spaced apart circular springs located on the contact surfaces of each housing section.

Thus, a feature of the present connector is understood to include a first or top rectangular prism 64 comprising two spring grooves 30, 32 and wherein the two spring grooves have groove bottom surfaces 66 that are at an angle to one another. As shown, the grooves 30, 32 have flat bottom groove surfaces that are orthogonal to one another. However, the grooves may be tapered from horizontal (i.e., tapered relative to the planar surface of the solar cells) so that the springs positioned therein are turned at a turn angle when pressed against the solar cells. In one embodiment, the spring groove 30 or 32 or both spring grooves each comprising a groove sidewall that is disposed at an angle 80 relative to the planar surface of the solar cells. In one embodiment, the angle 80 is an obtuse angle. In an alternative embodiment, the angle 80 is an acute angle.

A further feature of the present connector is a first or top rectangular prism 64 comprising at least two spring grooves 30, 32 and wherein at least one of the spring grooves comprises an extended channel 68 for receiving a connecting pin 14, which can also include a shaft or a rod. In a specific example, the extended channel 68 receives a vertical standing rib 16 that has a partial pin groove 62 formed thereon for receiving the connecting pin 14.

In another embodiment, the connector comprises a second rectangular prism 70 that forms a lower housing block 60 having a spring groove 34 with a groove bottom 66. As understood, the second rectangular prism 70 is smaller than the first rectangular prism 64, at least in width. In another embodiment, the second rectangular prism 70 is smaller in height than the first rectangular prism 64. The lower housing section 60 is preferably formed with a vertical standing rib 16 as a singularly formed unit. However, in another embodiment, the lower housing block 60 and the vertical standing rib 16 are separately formed and secured to one another using fasteners and optionally with a tongue and groove. Thus, the vertical standing rib 16 may be viewed as a connecting piece for connecting the two rectangular prisms 64, 70 together.

In another embodiment, each solar cell is understood to contact with at least one spring 38. As each spring 38 has an operating deflection range that biases directly against the surface of the solar cell so that adequate connection during thermal changes and/or vibrations can be maintained between the two solar cells 40, 42 and the connector 8. Also, because the springs are not welded to the solar cells, the solar cells can move laterally relative to the springs. Operating deflection of the canted coil spring is understood to include a working or deflection range of the canted coil spring, which has a somewhat constant spring force over the working range. This in turn allows vibration or movement within the deflection range to be absorbed by the canted coil spring. Operating deflection is well known in the art and further discussion is not believed necessary.

Figure 2:
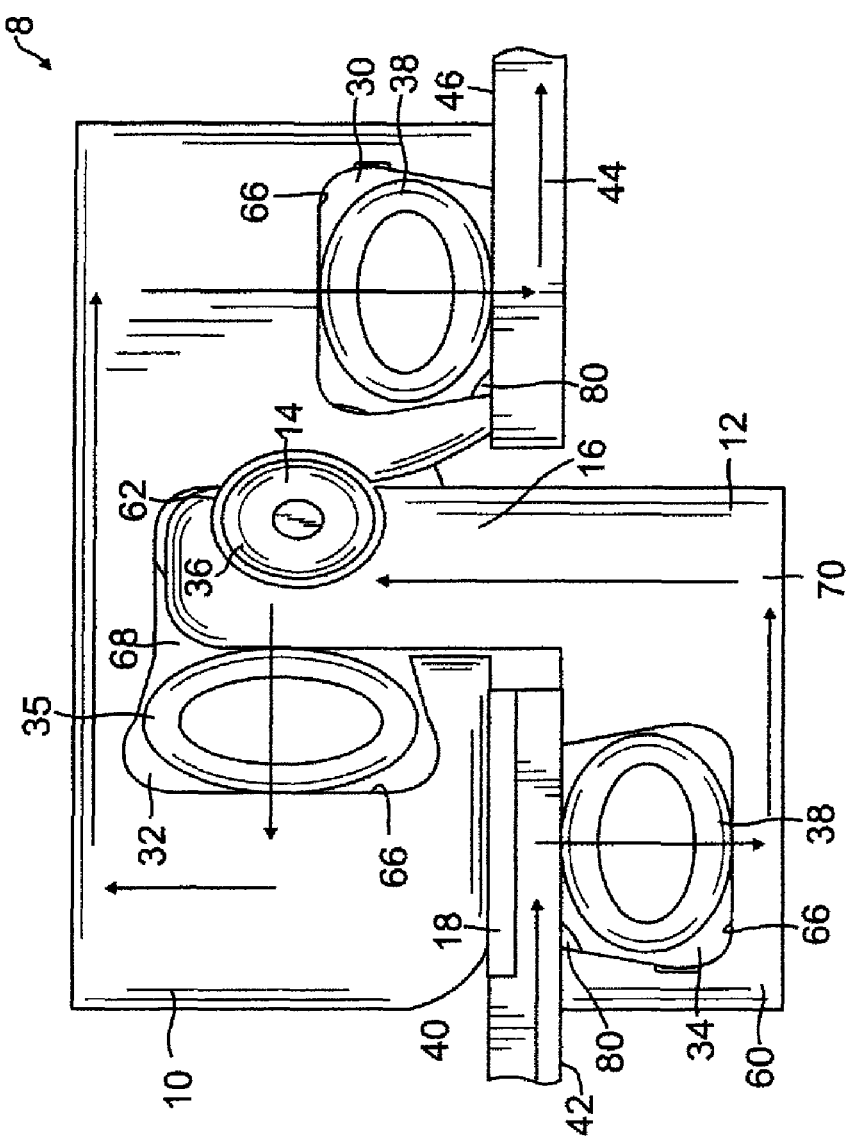
FIG. 2 shows a cross-sectional view of the device of FIG. 1.

In one example, current flows from the underside conductive pad 42 on one solar cell 40 through the spring 38, and into the lower housing 12. Current flows upwards into the vertical standing rib 16, and then into the spring 38, and on into the upper housing 10. From the upper housing it flows through the second upper housing spring 38, and into the contact pad 46 on the upper surface of the second solar array 44. In other words, when used to transmit electrical signals or current, the arrows in FIG. 2 show typical signal or current path. However, depending on how the system is configured, current can flow in reverse order, i.e., with the arrows pointing in the opposite direction than as shown.

To ensure proper current path, a non-conductive insulating pad 18 is placed on the upper surface of the first solar cell 40, protecting it from the electrical potential of the upper housing 10. In other examples, additional insulating pads 18 (not shown) are used to control, such as by guiding or preventing, electrical potential by strategic placements of the insulating pads.

The springs 38 may be axial or radial canted coil springs. The housings 10, 12 may be made of any conductive material, including copper and aluminum. The grooves may be tapered, flat-bottomed, or V-bottomed. The housings 10, 12 may be extruded or machined using electro-discharge methods. The springs may be plated to enhance conductivity of the system (lower system resistance). The housings may be similarly plated to enhance conductivity. In other embodiments, the housings and/or the springs may be made from multi-metallic layers to provide strength at elevated temperatures as well as high conductivity. For example, the housings and/or the springs may be made with multi-metallic layers or wires as described in co-pending application Ser. No. 12/767,421, filed Apr. 26, 2010, the contents of which are expressly incorporated herein by reference.

The device 8 may be used to join any two independent objects, plates or housings together and should not be viewed as limiting to electrical contacts or connectors. For example, the two solar cells may simply be panels made from metal, wood, plastic or fiberglass. In other embodiments, the objects to be gripped by the connector 8 are not planar in configuration. In other words, only sections to be gripped by the connector 8 have planar surface portions and not necessarily the rest of the objects to be gripped.

The above description presents the best mode contemplated for carrying out the present connectors, systems, and associated methods, and of the manner and process of making and using them, in such full, clear, concise, and exact terms as to enable any person skilled in the art to which it pertains to make and use these connectors, systems, and associated methods. These connectors, systems, and associated methods are, however, susceptible to modifications and alternate constructions from that discussed above that are fully equivalent. Consequently, these connectors, systems, and associated methods are not limited to the particular embodiments disclosed. On the contrary, these connectors, systems, and associated methods cover all modifications and alternate constructions coming within the spirit and scope of the connectors, systems, and associated methods as generally expressed by the following claims, which particularly point out and distinctly claim the subject matter of the connectors, systems, and associated methods.

What is claimed is:

1. A connector for connecting two elements, which have planar surface portions, together, said connector comprising:
    a first housing piece and a second housing piece, said first and second housing pieces each comprising a conductive material,
    a connecting piece for mechanically interlocking said first and second housing pieces together, said connecting piece projecting, at least in part, into the first housing piece; and
    wherein said first housing piece comprises a groove and said second housing pieces comprises a groove, each of said two grooves comprises a canted coil spring disposed therein and wherein the two canted coil springs are spaced-apart.

2. The connector according to claim 1, wherein the conductive material is copper or aluminum.

3. The connector according to claim 1, wherein the connecting piece is singularly formed with the second housing piece.

4. The connector according to claim 1, wherein the first housing piece comprises a second spring groove.

5. The connector according to claim 3, wherein the connecting piece comprises a partial pin groove.

6. The connector according to claim 5, further comprising a cylindrical pin disposed in the partial pin groove.

7. The connector according to claim 1, further comprising a connecting pin of a polygonal cross section.

8. The connector according to claim 1, further comprising a connecting pin of rectangular cross section.

9. The connector according to claim 1, further comprising a connecting pin of trapezoidal cross section.

10. The connector according to claim 1, wherein at least one of the grooves comprises a groove sidewall that is perpendicular to a contact surface of one of the planar surface portions.

11. The connector according to claim 1, wherein at least one of the grooves comprises a groove sidewall that is disposed at an acute angle to a contact surface of one of the planar surface portions.

12. The connector according to claim 1, wherein at least one of the grooves comprises a groove sidewall that is disposed at an obtuse angle to a contact surface of one of the planar surface portions.

13. A method for connecting two elements, which have planar surface portions, together, said method comprising:
    placing a first housing piece against a first element so that a spring disposed in a groove in said first housing piece contacts a planar surface of said first element;
    placing a second housing piece against the first element and a second element so that a spring disposed in a groove in said second housing piece contacts a planar surface of said second element;
    projecting a connecting piece into a gap of said first housing piece; and
    securing said connecting piece with said first housing piece so that a spring force is biased against said first element and said second element.

14. The method according to claim 13, comprising inserting a connecting pin into a gap in the connecting piece.

15. The method according to claim 14, wherein the connecting piece comprises at least one of a round cross-section, a tapered cross-section, and a polygon cross-section.

16. The method according to claim 13, further comprising applying a cladding layer to at least one of the first housing piece and the second housing piece.

17. The method according to claim 13, further comprising a second groove in the first housing piece, said second groove comprising a canted coil spring.

18. The method according to claim 13, wherein the two springs are made from multi-metallic wires.

19. The method according to claim 13, wherein the gap of said first housing piece is extended into a second spring groove having a canted coil spring disposed therein.

20. The method according to claim 13, wherein the connecting piece and the first housing piece are unitarily formed.

* * * * *